United States Patent [19]
Noda

[11] Patent Number: 6,043,135
[45] Date of Patent: Mar. 28, 2000

[54] PROCESS OF FABRICATING A SEMICONDUCTOR DEVICE HAVING TRENCH ISOLATION ALLOWING PATTERN IMAGE TO BE EXACTLY TRANSFERRED TO PHOTO-RESIST LAYER EXTENDING THEREON

[75] Inventor: Kenji Noda, Tokyo, Japan

[73] Assignee: NEC Corporation, Tokyo, Japan

[21] Appl. No.: 09/019,442

[22] Filed: Feb. 5, 1998

[30] Foreign Application Priority Data

Feb. 6, 1997 [JP] Japan .................................. 9-023605

[51] Int. Cl.[7] .................................................. H01L 21/76
[52] U.S. Cl. ............................................ 438/404; 438/424
[58] Field of Search ...................................... 438/404, 424

[56] References Cited

U.S. PATENT DOCUMENTS

| 4,857,477 | 8/1989 | Kanamori . |
| 5,674,775 | 10/1997 | Ho et al. . |
| 5,795,811 | 8/1998 | Kim et al. . |

FOREIGN PATENT DOCUMENTS

| 63-76330 | 4/1988 | Japan . |
| 1-107554 | 4/1989 | Japan . |
| 2174139 | 4/1990 | Japan . |
| 2-174139 | 7/1990 | Japan . |
| 7-193121 | 7/1995 | Japan . |
| 8-236609 | 9/1996 | Japan . |
| 8-274157 | 10/1996 | Japan . |

OTHER PUBLICATIONS

Perera et al., "Trench Isolation for .045 μm Active Pitch and Below", IEDM Technical Digest, 1995, pp. 679–682.

*Primary Examiner*—John F. Niebling
*Assistant Examiner*—Josetta Jones
*Attorney, Agent, or Firm*—Foley & Lardner

[57] ABSTRACT

A trench isolation is formed in a silicon substrate for defining active areas assigned to circuit components, and has an upper surface lower than a gate oxide layer grown on the adjacent active area; when the trench isolation is formed, silicon oxide is removed from the periphery of the silicon substrate defining a trench, then the surface of the silicon substrate is oxidized so that the silicon oxide deeply penetrates from the periphery into the silicon substrate, and, thereafter, insulating material fills the secondary trench defined by the silicon oxide; even through a gate electrode is patterned over the trench isolation, a pattern image for the gate electrode is exactly transferred to a photo-resist layer extending over the trench isolation, and the deeply penetrated silicon oxide prevents the channel region from concentration of electric field, thereby preventing the field effect transistor from the kinks and the inverse narrow width effect.

12 Claims, 14 Drawing Sheets

PROCESS OF FABRICATING A SEMICONDUCTOR DEVICE HAVING TRENCH ISOLATION ALLOWING PATTERN IMAGE TO BE EXACTLY TRANSFERRED TO PHOTO-RESIST LAYER EXTENDING THEREON

FIELD OF THE INVENTION

This invention relates to a process of fabricating a semiconductor device and, more particularly, to a process of fabricating a semiconductor device having a trench isolation allowing a pattern image to be exactly transferred to a photo-resist layer extending thereon.

DESCRIPTION OF THE RELATED ART

Circuit components of an integrated circuit device are scaled down, and an isolation between the circuit components is narrowed. The LOCOS (local oxidation of silicon) process is conventionally used for the isolation. However, the bird's beak unavoidably takes place around the periphery of the field dioxide layer produced through the LOCOS process. The bird's beak is an obstacle for reduction of active area. A trench isolation is substantially free from the bird's beak, and is employed in an ultra large scale integration.

FIGS. 1A to 1F illustrate the prior art process for forming the trench isolation, and the process shown in FIGS. 1A to 1F is hereinbelow referred to as "first prior art process". The prior art process starts with preparation of silicon substrate 1. Silicon dioxide is thermally grown to 10 nanometers thick on the major surface of the silicon substrate 1, and forms a silicon dioxide layer 2. Silicon nitride is deposited to 100 nanometers thick over the entire surface of the silicon dioxide layer 2 by using a chemical vapor deposition, and a silicon nitride layer 3 is laminated on the silicon dioxide layer 2.

A photo-resist etching mask (not show) is patterned on the silicon nitride layer 3 by using lithographic techniques, and the silicon nitride layer 3 is partially uncovered with the photo-resist etching mask. The exposed area of the silicon nitride layer 3 is etched away, and an opening 4 is formed in the silicon nitride layer 3 as shown in FIG. 1A.

Using the silicon nitride layer 3 as an etching mask, the silicon dioxide layer 2 and the silicon substrate 1 are anisotropically etched away, and a trench 5 of 300 nanometers deep is formed in the silicon substrate 1 as shown in FIG. 1B.

Silicon dioxide is thermally grown on the inner wall portion of the silicon substrate 1 defining the trench 5, and the silicon dioxide 6 is merged with the silicon dioxide layer 2. When the thermal oxidation is appropriately controlled, the peripheral portion 7 of the silicon dioxide layer is rounded as shown in FIG. 1C.

Subsequently, silicon dioxide is deposited to 1 micron thick. The silicon dioxide fills the trench 5, and swells into a silicon dioxide layer. The silicon dioxide is anisotropically etched without an etching mask, and a silicon dioxide layer 8 is left in the trench 5 as shown in FIG. 1D.

The silicon nitride layer 3 is removed from the upper surface of the silicon dioxide layer 2 as shown in FIG. 1E, and the trench isolation is completed.

If a field effect transistor is formed on the left side of the trench isolation, channel doping is carried out, and the silicon dioxide layer 2 is etched away, and a gate oxide layer is thermally grown to 10 nanometers thick. Polysilicon is deposited to 200 nanometers thick, and the polysilicon layer is patterned through the lithographic process and an etching technique. Then, a polysilicon gate electrode 10 is left on the gate oxide layer 9 as shown in FIG. 1F.

When the silicon dioxide layer is etched back, the manufacturer takes a margin into account, and the silicon dioxide layer is usually over-etched. As a result, the upper surface of the silicon dioxide layer 8 becomes lower than the upper surface of the silicon dioxide layer 2, and a step 11 takes place between the gate oxide layer 9 and the silicon dioxide layer 8. The gate electrode 10 conformably extends from the gate oxide layer 9 to the silicon dioxide layer 8, and the step 11 is covered with the gate electrode 10.

When a potential is applied to the gate electrode 10, electric field is concentrated around the silicon substrate 1 adjacent to the step 11 as indicated by arrows 12, and a parasitic transistor with a lower threshold takes place there. The parasitic transistor is causative of kinks of the gate voltage-to-drain current characteristics $V_G$–$I_D$ of the field effect transistor as shown in FIG. 2. If the parasitic transistor does not take place, the gate voltage-to-drain current characteristics $V_G$–$I_D$ is indicated by plots PL1. However, the kinks change the gate voltage-to-drain current characteristics $V_G$–$I_D$ to plots PL2. Although the rounded edge 7 is fairly effective against the kinks, it is less effective against the inverse narrow width effect. Namely, the threshold of the field effect transistor is undesirably decreased from plots PL3 to PL4 as shown in FIG. 3.

Asanga H. Perera et al proposes a solution against those undesirable phenomena in "TRENCH ISOLATION for 0.45 μm ACTIVE PITCH and BELOW", IEDM Technical Digest, 1995, pages 679 to 682. The process proposed in the paper is hereinbelow referred to as "second prior art process". Perera stops the anisotropic etching when the upper surface of the silicon dioxide layer 8 reaches a certain point between the upper surface of the silicon nitride layer 3 and the upper surface of the silicon substrate 1. FIGS. 4A to 4C show the second prior art process. The second prior art process is similar to the first prior art process until the silicon dioxide swells into the silicon dioxide layer over the silicon nitride layer. For this reason, the silicon substrate and the silicon dioxide layers are labeled with the same references designating corresponding substrate and layers in the first prior art process.

The silicon dioxide layer 17 is partially removed by using a chemical mechanical polishing, and the polishing is terminated when the silicon dioxide layer 17 is decreased between the upper surface of the silicon nitride layer 3 and the silicon substrate 1 as shown in FIG. 4A.

The silicon nitride layer 3 is removed as shown in FIG. 4B, and the trench isolation is completed. Dopant impurity is ion implanted into a channel region 18 so as to control the threshold of a field effect transistor, and the silicon dioxide layer 2 is removed. The upper surface of the silicon substrate 1 is exposed, again. The silicon substrate 1 is thermally oxidized, and a gate oxide layer 19 is grown to 10 nanometers thick over the channel region 18. Polysilicon is deposited to 200 nanometers thick over the entire surface of the resultant semiconductor structure, and a photo-resist etching mask (not shown) is patterned on the polysilicon layer through the lithographic process. Using the photo-resist etching mask, the polysilicon layer is patterned into a gate electrode 20 as shown in FIG. 20.

Japanese Patent Publication of Unexamined Application No. 7-193121 discloses another process effective against the kinds and the inverse narrow width effect. The process disclosed in the Japanese Patent Publication of Unexamined Application is hereinbelow referred to as "third prior art process", and FIGS. 5A to 5G illustrate the third prior art process. The third prior art process starts with preparation of a silicon substrate 21. Silicon dioxide is thermally grown to 10 nanometers thick, and the silicon substrate 21 is covered with a silicon dioxide layer 22. Polysilicon is deposited to 200 nanometers thick over the entire surface of the silicon dioxide layer 22 by using a chemical vapor deposition, and the silicon dioxide layer 22 is overlain by a polysilicon-layer 23. Silicon dioxide is deposited to 200 nanometers thick over the polysilicon layer 23, and a silicon dioxide layer 24 is laminated on the polysilicon layer 23. A photo-resist etching mask 25 is patterned on the silicon dioxide layer 34 through the lithographic process as shown in FIG. 5A.

Using the photo-resist etching mask, the silicon dioxide layer 24 and the polysilicon layer 23 are successively etched by using anisotropic etching technique. An opening 26 is formed in the silicon dioxide layer 24 and the polysilicon layer 23. After the anisotropic etching, the polysilicon layer 23 is isotropically etched, and an opening 27 is formed in the polysilicon layer 23. The opening 27 is wider than the opening 26 as shown in FIG. 5B. The inner surface defining the opening 27 is retracted from the inner surface defining the opening 26 by 100 nanometers.

The silicon dioxide layer 22 is partially removed, and the silicon substrate 21 is etched so as to form an isolation trench 28 as shown in FIG. 5C. The isolation trench 28 is of the order of 500 nanometers in depth.

The silicon dioxide layer 24 is etched away by using NH$_4$F solution, and a surface of the polysilicon and an inner surface of the silicon substrate 21 are thermally oxidized, and a silicon dioxide layer 29 is grown to 20 nanometers thick as shown in FIG. 5D.

Silicon dioxide is deposited over the entire surface of the resultant semiconductor structure by using a chemical vapor deposition. The silicon dioxide fills the isolation trench 28 and the opening 27, and swells into a silicon dioxide layer 30 of 1 micron thick as shown in FIG. 5D.

The silicon dioxide layer 30 is uniformly removed by using an etch-back technique or a polishing technique. The polysilicon layer 23 serves as a stopper. For this reason, the silicon dioxide layer 30 is coplanar with the polysilicon layer 23 as shown in FIG. 5E. The polysilicon layer 23 is removed from the resultant semiconductor structure, and the silicon oxide layer 30 projects over the silicon dioxide layer 22 as shown in FIG. 5F. The silicon oxide layer 30 serves as a major portion of the trench isolation.

Finally, polysilicon is deposited over the entire surface of the resultant semiconductor structure, and the silicon dioxide layers 29/30 are covered with a polysilicon layer, and the polysilicon layer 31 is patterned into a gate electrode 31. The trench isolation formed through the third prior art process projects from the silicon substrate 21, and the periphery of the opening 28 is covered with the silicon dioxide layer 30. For this reason, the electric field is less concentrated around the periphery of the opening 28.

The first prior art process makes the trench isolation lower than the upper surface of the silicon substrate 1, and allows the electric field to be concentrated around the peripheral edge of the trench. As a result, the field effect transistor suffers from the kinks and the inverse narrow width effect.

The second and third prior art processes make the trench isolation project over the silicon substrate, and the electric field is less concentrated around the peripheral edge of the trench. However, when the polysilicon layer is patterned into the gate electrode 20/31, the step between the silicon oxide layer and the trench isolation is transferred to a photo-resist layer, and the photo-resist layer is different in thickness between the portion over the trench isolation and the portion over the channel region. Moreover, the reflection on the step makes a photo-resist etching mask constricted. When the polysilicon layer is patterned into the gate electrode 20/30 by using the photo-resist etching mask, the gate electrode 20/30 is changed in width at the boundary between the trench isolation and the channel region.

SUMMARY OF THE INVENTION

It is therefore an important object of the present invention to provide a process of fabricating a semiconductor device having a trench isolation, which does not project over a semiconductor substrate without concentration of electric field.

To accomplish the object, the present invention proposes to increase the thickness of oxide layer around a peripheral portion defining a trench.

In accordance with one aspect of the present invention, there is provided a process of fabricating a semiconductor device, and the process comprises the steps of preparing a substrate formed of an oxidizable material, forming a first layer of a first material on a major surface of the substrate, forming a second layer of a non-oxidizable material on the first layer, forming a first opening in the second layer so that the first layer is exposed to the first opening, forming a side wall spacer on an inner wall of the second layer so as to form a second opening nested in the first opening, an area of the substrate is exposed to the second opening, forming a trench penetrating from the second opening into the substrate, oxidizing a surface portion of the substrate defining the trench so as to form an oxide wall defining a secondary trench and having an upper peripheral portion thicker than a lower portion thereof, and filling the secondary trench with a second material having an upper surface coplanar with or close to the upper surface of the major surface so as to form a trench isolation in the substrate.

BRIEF DESCRIPTION OF THE DRAWINGS

The features and advantages of the process will be more clearly understood from the following description taken in conjunction with the accompanying drawings in which.

DESCRIPTION OF THE PREFERRED EMBODIMENTS

First Embodiment

FIGS. 6A to 6I illustrate a process of fabricating a semiconductor device embodying the present invention. The process starts with preparation of a silicon substrate 41. Silicon dioxide is thermally grown to 10 nanometers thick over the major surface of the silicon substrate 41, and a pad oxide layer 42 is formed on the major surface of the silicon substrate 41. Silicon nitride is deposited to 100 nanometers thick over the pad oxide layer 42 by using a chemical vapor deposition, and a silicon nitride layer 43 is laminated on the pad oxide layer 42.

Photo-resist solution is spun onto the silicon nitride layer 43, and is baked so as to form a photo-resist layer. A pattern image is transferred to the photo-resist layer, and a latent image is formed in the photo-resist layer. The latent image is developed, and the photo-resist layer is patterned into a photo-resist etching mask (not shown). In this way, the photo-resist etching mask is formed through lithographic techniques.

Figure 6A:
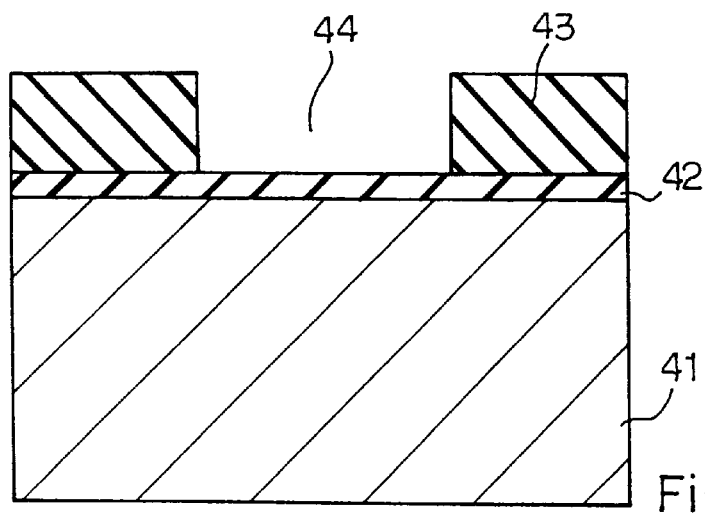
FIGS. 6A to 6I are cross sectional views showing a process of fabricating a semiconductor device according to the present invention.

Using the photo-resist etching mask, the silicon nitride layer 43 is selectively etched away, and an opening 44 is formed in the silicon nitride layer 43 as shown in FIG. 6A. The opening 44 is wider than a trench to be formed in the silicon substrate 41.

Figure 6B:
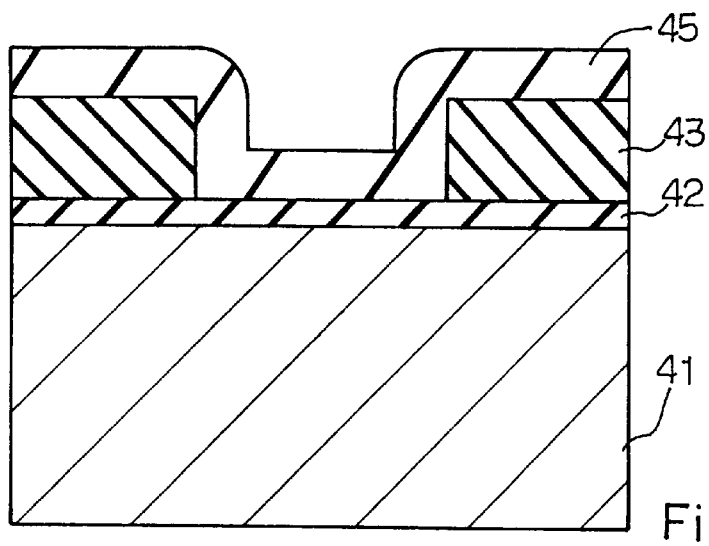
Figure 6C:
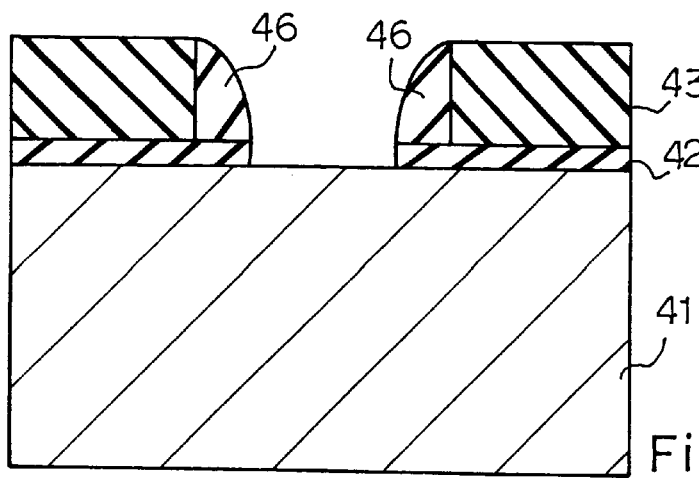
Figure 6D:
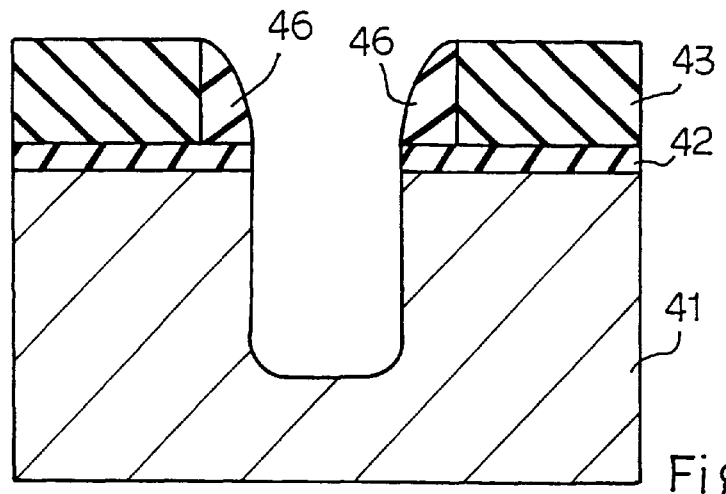
Figure 6E:
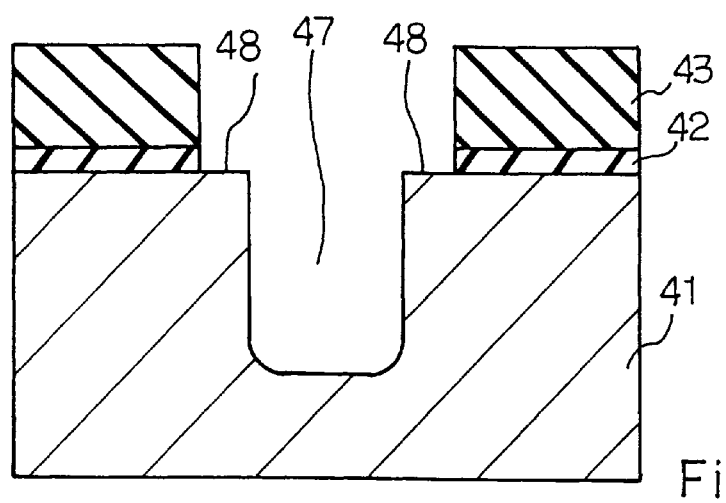

Silicon dioxide is deposited to 100 nanometers thick over the entire surface of the resultant semiconductor structure by using a chemical vapor deposition, and a silicon dioxide layer 45 conformally extends over the silicon nitride layer 43 and the exposed pad oxide layer 42 as shown in FIG. 6B. The silicon dioxide layer 45 and the pad oxide layer 42 are anisotropically etched away until the silicon substrate is exposed, and a side wall spacer 46 is formed from the silicon dioxide layer 45 as shown in FIG. 6C.

Figure 6F:
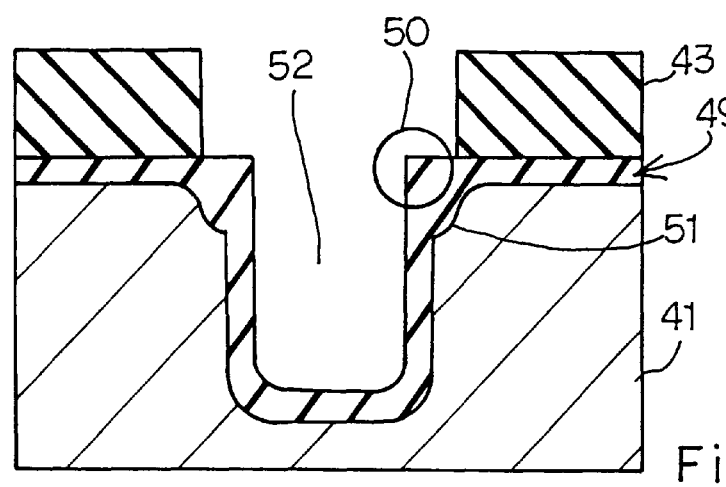

Using the silicon nitride layer 43 and the side wall spacer 46 as an etching mask, the silicon substrate 41 is anisotropically etched away, and a trench 47 is formed in the silicon substrate 41. The trench 47 is of the order of 300 nanometers in depth. The side wall spacer 46 and the pad oxide layer 42 under the side wall spacer 46 are isotropically etched away, and a peripheral are 48 of the silicon substrate 41, which defines the trench 47, is exposed as shown in FIG. 6F. The side wall spacer 46 may be etched away by using a wet etching technique.

The peripheral area 48 and an inner wall portion of the silicon substrate 41 are thermally oxidized so as to grow silicon oxide on the peripheral area 48 and the inner wall portion. The silicon oxide is merged with the pad oxide layer 42, and forms a silicon oxide layer 49 as shown in FIG. 6F. The oxidation proceeds from both of the peripheral area 48 and the inner surface into the silicon substrate 41, and the silicon oxide layer 49 around the peripheral edge 50 becomes thicker than the other portion of the silicon oxide layer 49. The oxidation is carried out at 980 degrees to 1100 degrees in centigrade, and the inner surface 51 of the silicon oxide at the peripheral edge 50 is rounded. For this reason, a bird's beak under the silicon nitride layer is restricted. The silicon oxide layer 49 defines a secondary trench 52.

If the oxidant passes the side wall spacer 46 much faster than the silicon nitride layer 43, the oxidation may be carried out before the removal of the side wall spacer 46.

Figure 6G:
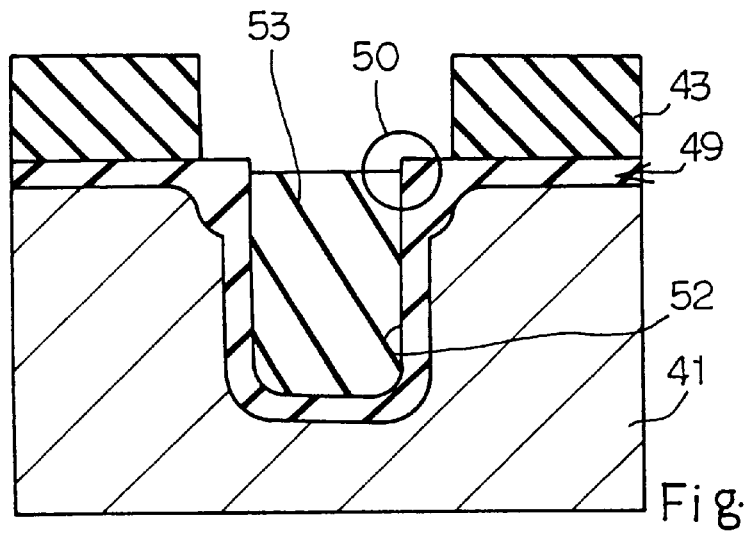

Silicon dioxide is deposited over the entire surface of the resultant semiconductor structure by using the chemical vapor deposition. The silicon dioxide fills the secondary trench 52, and swells into a silicon dioxide layer 53 of 1 micron thick over the silicon nitride layer 43. The silicon dioxide layer 53 is uniformly removed until the upper surface becomes substantially coplanar with the silicon substrate 41 or slightly higher than the silicon substrate 41 as shown in FIG. 6G. Anisotropic etching or a chemical mechanical polishing is available for the silicon oxide layer 53.

Figure 6H:
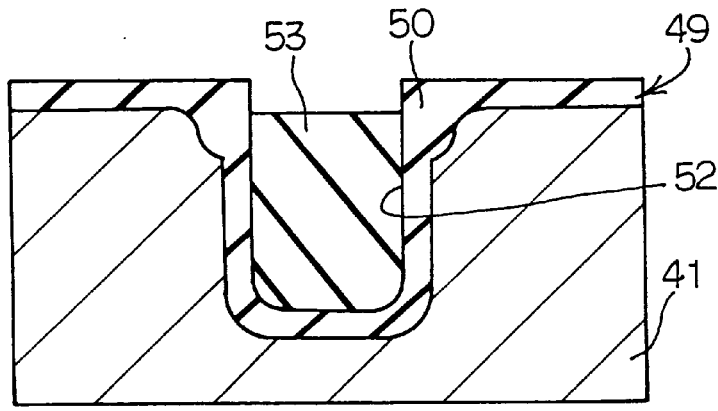

The silicon nitride layer 43 is removed from the resultant semiconductor structure, and a trench isolation is left in the silicon substrate 41 as shown in FIG. 6H. The trench isolation 49/53 defines active areas, and one of the active areas is assigned to a field effect transistor.

Figure 6I:
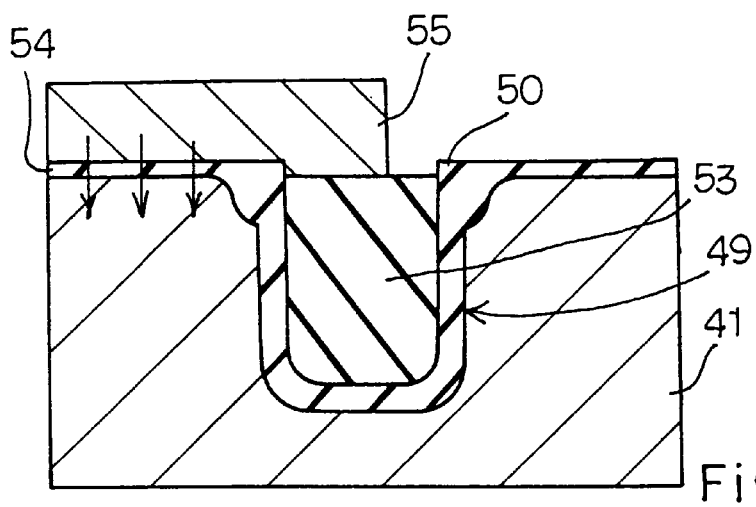

Dopant impurity is ion implanted through the silicon oxide layer 49 into the active area assigned to the field effect transistor, and regulates the threshold to a predetermined value. The silicon oxide layer 49 is removed from the active area, and the active area is thermally oxidized so as to form a gate oxide layer 54 of 10 nanometers thick. Polysilicon is deposited to 200 nanometers thick over the entire surface of the resultant semiconductor structure, and a photo-resist etching mask (not shown) is patterned on the polysilicon layer by using the lithographic techniques. The polysilicon layer is selectively etched away, and is patterned into a gate electrode 55 as shown in FIG. 6I. Dopant impurity is ion implanted into the active area, and forms source and drain regions in a self-aligned manner with the gate electrode 55.

As will be understood from the foregoing description, the trench isolation 53 does not project over the gate oxide layer 54, and a flat photo-resist layer is formed over the trench isolation 53. For this reason, the pattern image for the gate electrode 55 is exactly transferred to a photo-resist layer, and the polysilicon layer is shaped into the target configuration for the gate electrode 55. The peripheral edge 50 is so thick and round that the gate electrode 55 does not concentrate the electric field. For this reason, the field effect transistor is prevented from the kinks and the inverse narrow width effect.

Second Embodiment

FIGS. 7A to 7J illustrate another process of fabricating a semiconductor device embodying the present invention. The process starts with preparation of a silicon substrate 61. Silicon dioxide is thermally grown to 10 nanometers thick over the major surface of the silicon substrate 61, and a pad oxide layer 62 is formed on the major surface of the silicon substrate 61. Silicon nitride is deposited to 100 nanometers thick over the pad oxide layer 42 by using a chemical vapor deposition, and a silicon nitride layer 63 is laminated on the pad oxide layer 62.

Figure 7A:
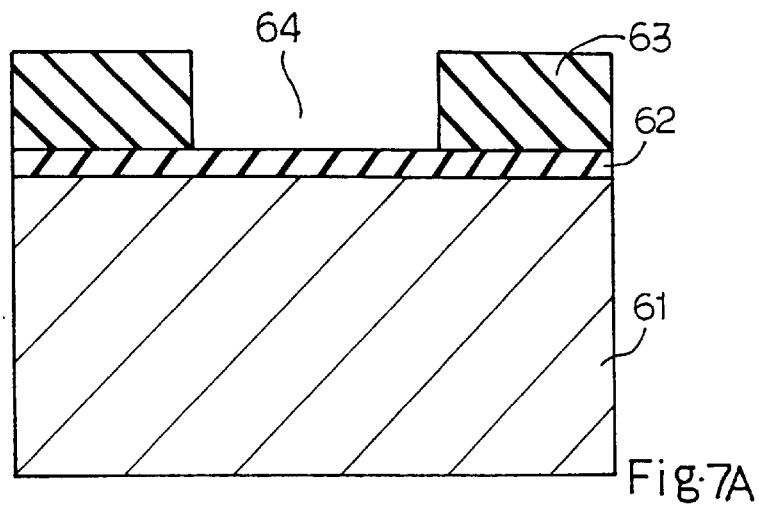
FIGS. 7A to 7J are cross sectional views showing another process of fabricating a semiconductor device according to the present invention.

A photo-resist etching mask (not shown) is formed through the lithographic techniques, the silicon nitride layer 63 is selectively etched away. An opening 64 is formed in the silicon nitride layer 63 as shown in FIG. 7A. The opening 64 is wider than a trench to be formed in the silicon substrate 61.

Figure 7B:
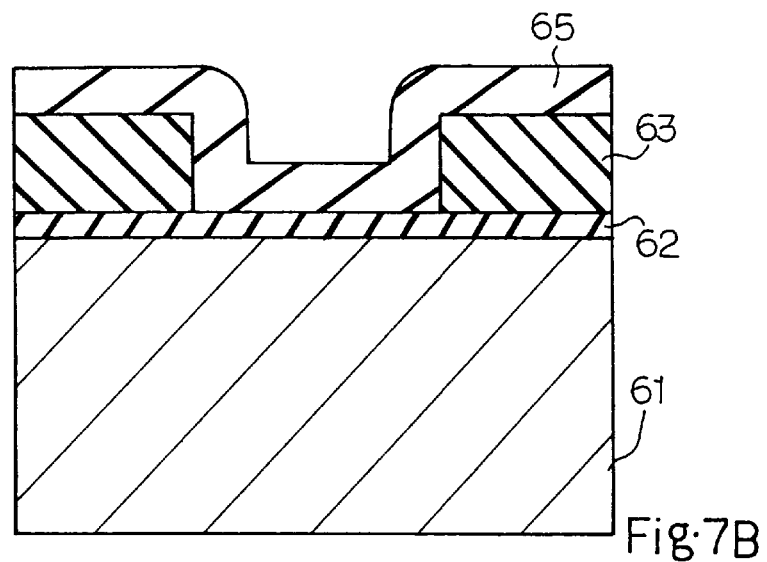
Figure 7C:
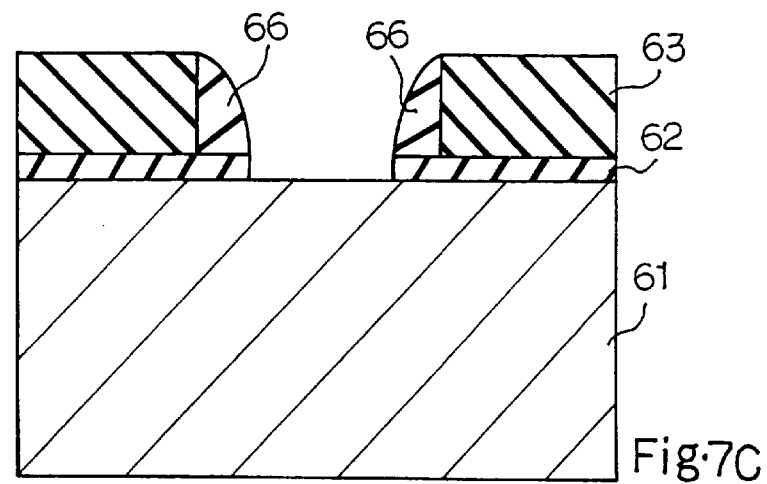

Silicon dioxide is deposited to 100 nanometers thick over the entire surface of the resultant semiconductor structure by using a chemical vapor deposition, and a silicon dioxide layer 65 conformally extends over the silicon nitride layer 63 and the exposed pad oxide layer 62 as shown in FIG. 7B. The silicon dioxide layer 65 and the pad oxide layer 62 are anisotropically etched away until the silicon substrate 61 is exposed, and a side wall spacer 66 is formed from the silicon dioxide layer 65 as shown in FIG. 7C.

Figure 7D:
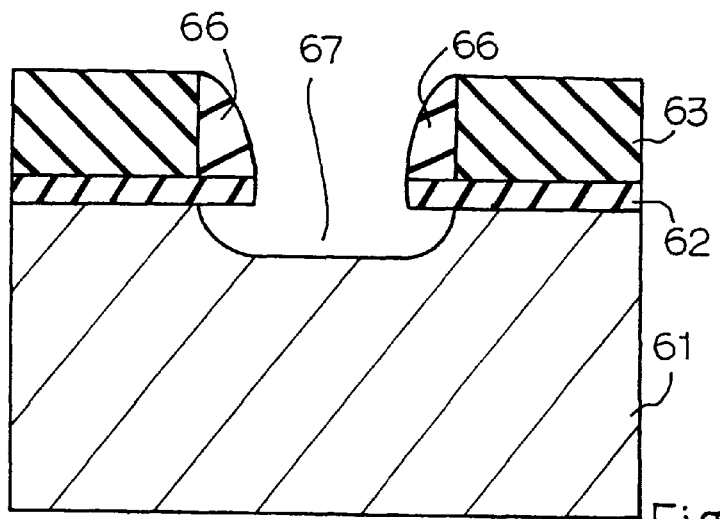

Using the side wall spacer 66 and the silicon nitride layer 63 as an etching mask, the silicon substrate 61 is isotropically etched so as to form a recess 67 of 50 nanometers deep. The recess 67 is sidewardly expanded, and the periphery is under the pad oxide layer 62 as shown in FIG. 7D. A chemical dry etching or a wet etching is available for the formation of the recess 67.

Figure 7E:
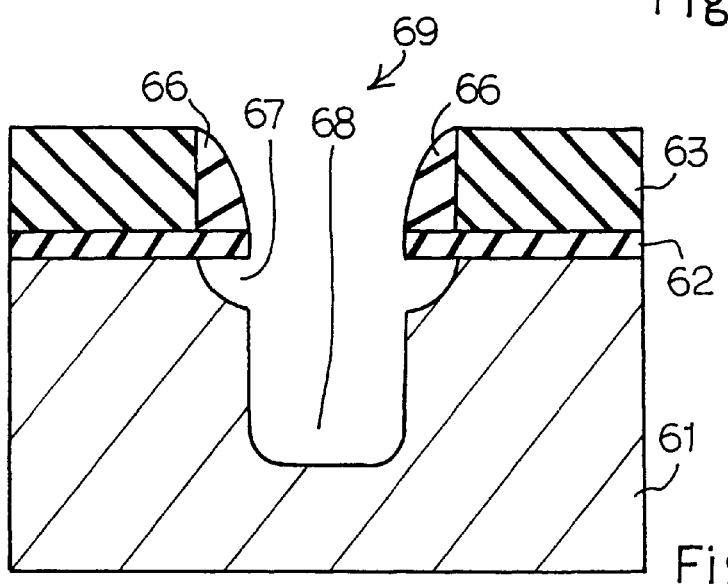

Subsequently, the silicon substrate 61 is anisotropically etched by using the silicon nitride layer 63 and the side wall spacer 66 as an etching mask, and a groove 68 is formed in the silicon substrate 61. The groove 68 is of the order of 300 nanometers in depth. The groove 68 is narrower than the recess 67, and is open to the bottom surface defining the recess 67 as shown in FIG. 7E. The groove 68 and the recess 67 as a whole constitute a trench 69, and form a narrow lower portion and a wide upper portion of the trench 69, respectively.

Figure 7F:
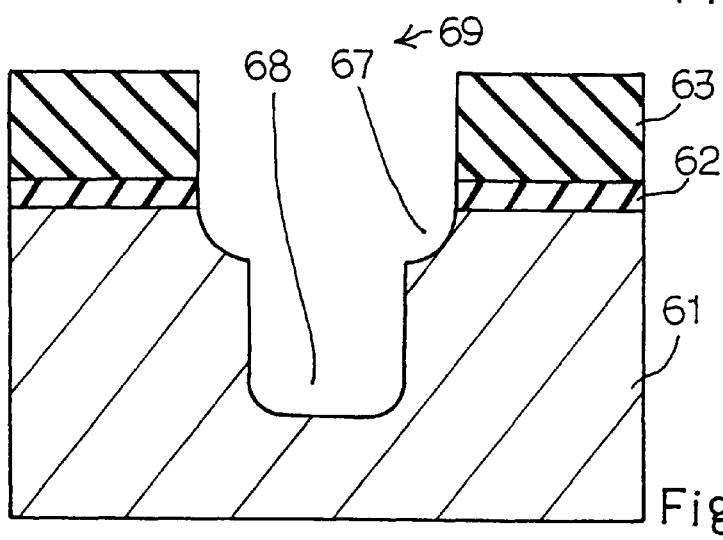

The side wall spacer 66 and the peripheral portion of the pad oxide layer 62 beneath the side wall spacer 66 are isotropically etched away as shown in FIG. 7F. Wet etchant may be used for the isotropic etching.

Figure 7G:
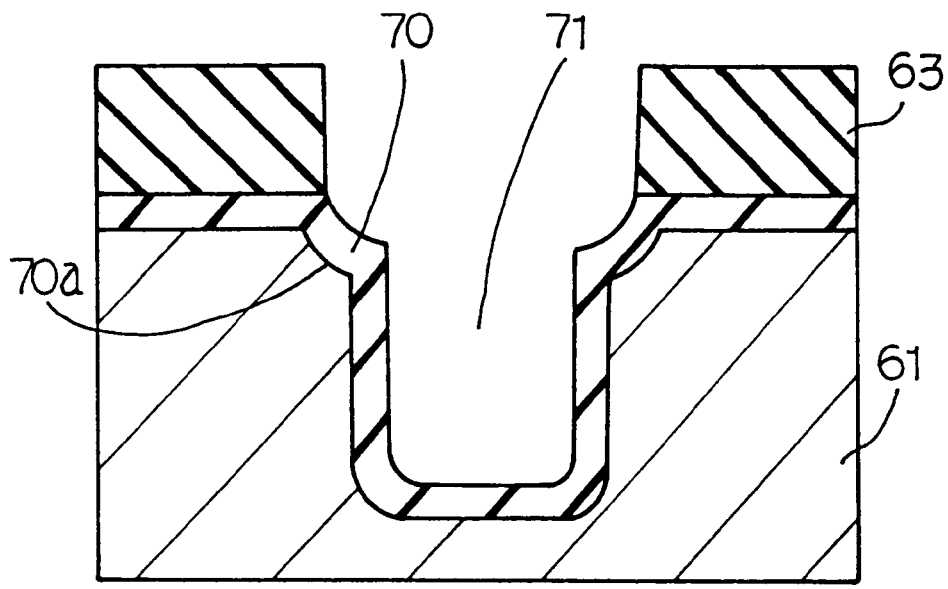

The exposed surface of the silicon substrate 61 is thermally oxidized at 980 degrees to 1100 degrees in centigrade, and silicon dioxide is grown. The thermal oxidation makes the boundary 70a between the silicon substrate and the silicon dioxide further gentle, and restricts a bird's beak under the silicon nitride layer 63. The silicon dioxide is merged into the pad oxide layer so as to form a silicon dioxide layer 70 as shown in FIG. 7G, and defines a secondary trench 71. If the oxidant penetrates the side wall spacer 66 much faster than the silicon nitride layer 63, the thermal oxidation is carried out before the removal of the side wall spacer 66 and the part of the pad oxide layer 62.

Figure 7H:
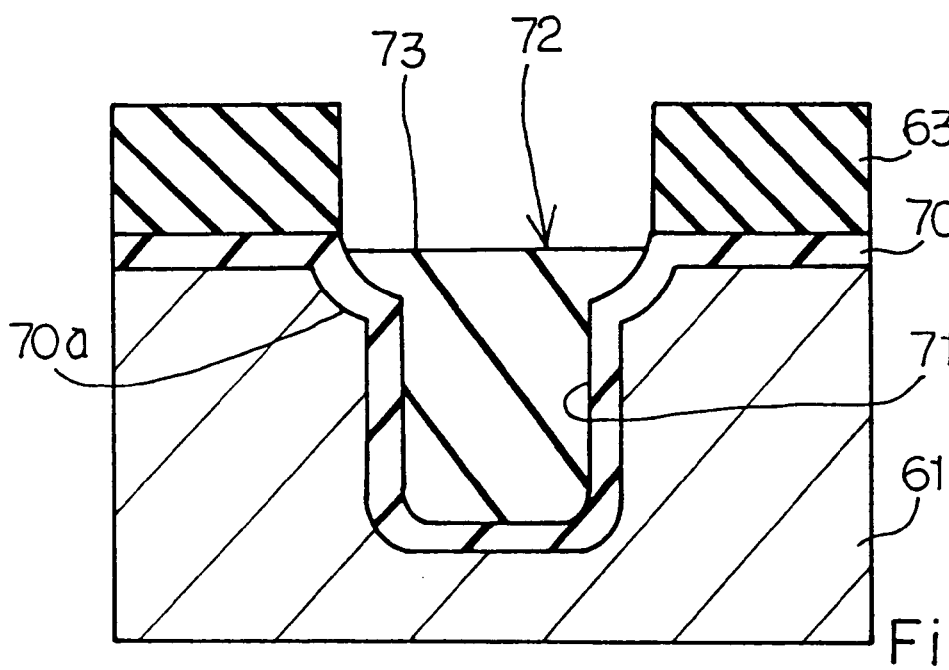

Silicon dioxide is deposited over the entire surface of the resultant semiconductor structure by using the chemical vapor deposition. The silicon dioxide fills the secondary trench 71, and swells into a silicon dioxide layer 72 of 1 micron thick over the silicon nitride layer 63. The silicon dioxide layer 72 is uniformly removed by using an anisotropic etching technique or a chemical mechanical etching until the upper surface 73 becomes substantially coplanar with or slightly higher than the upper surface of the silicon substrate 61 as shown in FIG. 7H.

Figure 7I:
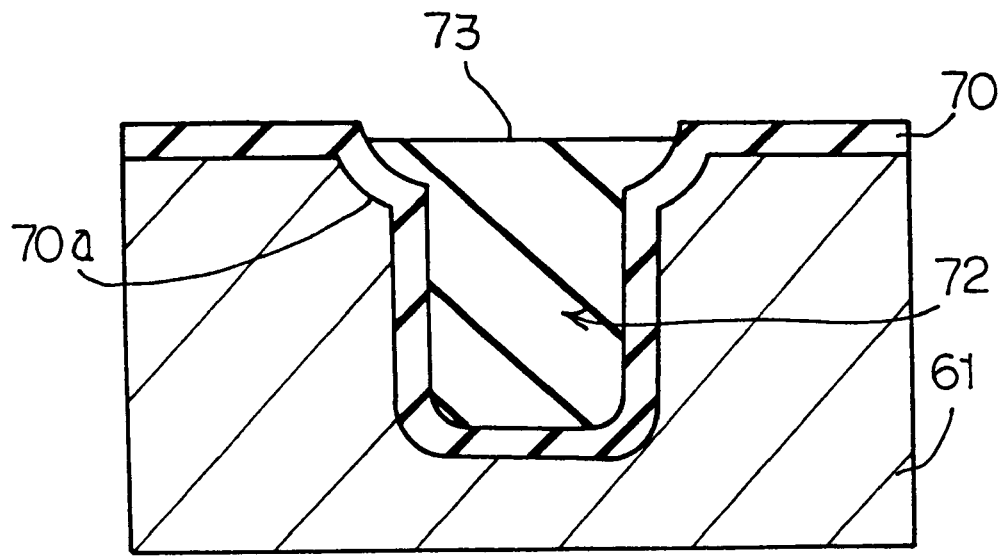
Figure 7J:
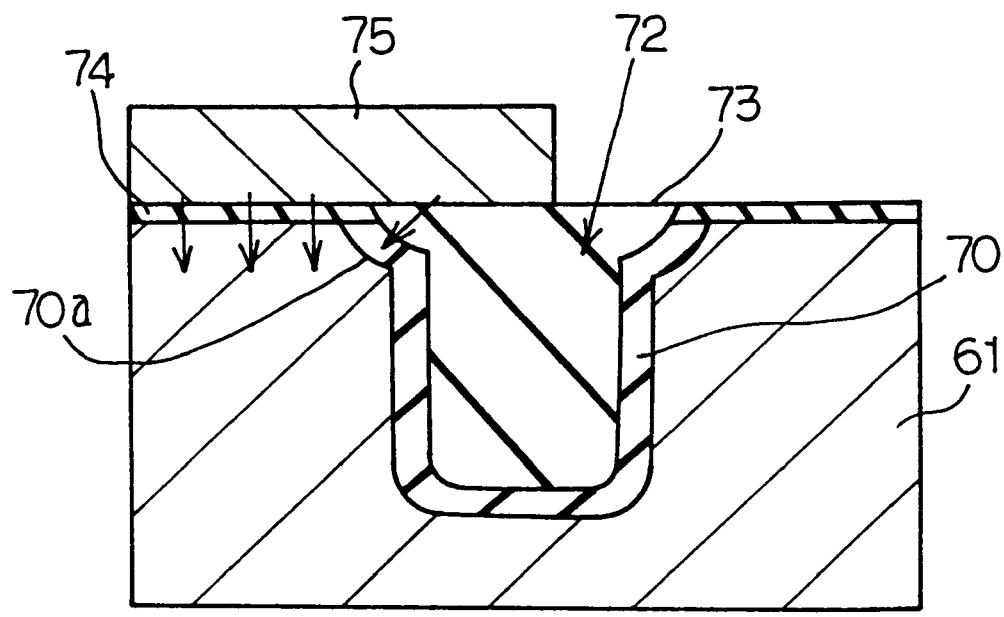

The silicon nitride layer 63 is removed from the resultant semiconductor structure, and a trench isolation 70/72 is completed as shown in FIG. 7I. The trench isolation 70/72 defines an active area on the left side thereof, and is assigned to a field effect transistor.

Subsequently, the field effect transistor is fabricated on the active area as follows. First, dopant impurity is ion implanted through the silicon oxide layer 70 into the active area so as to regulate the threshold of the field effect transistor to a predetermined level. The silicon dioxide layer 70 is removed from the major surface of the silicon substrate 61, and is left in the trench. The active area is exposed. Thereafter, the active area is thermally oxidized, and a gate oxide layer 74 is thermally grown to 10 nanometers thick on the active area. The upper surface 73 is substantially coplanar with or lower than the upper surface of the gate oxide layer 74.

Figure 1A:
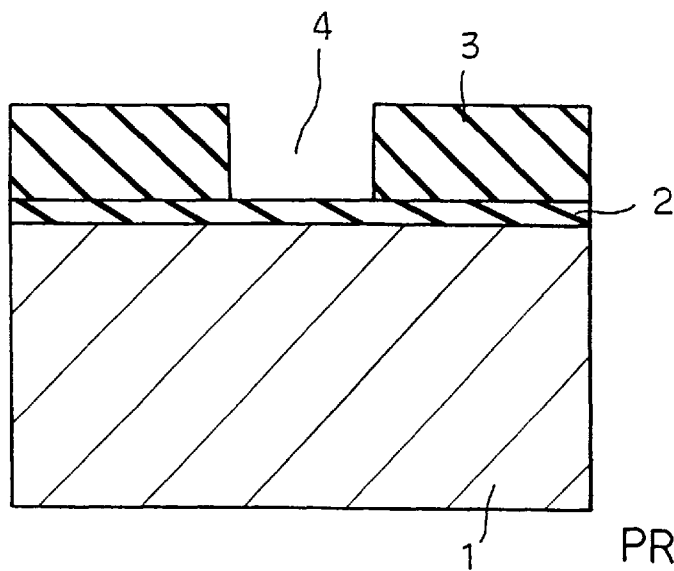
FIGS. 1A to 1F are cross sectional views showing the first prior art process of forming a trench isolation.
Figure 1B:
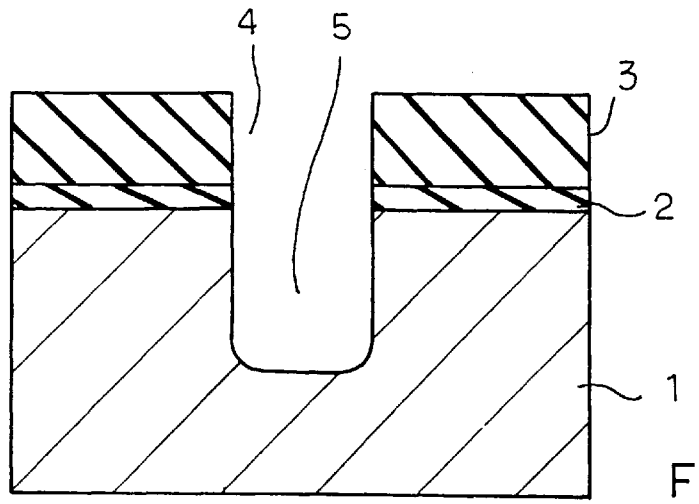
Figure 1C:
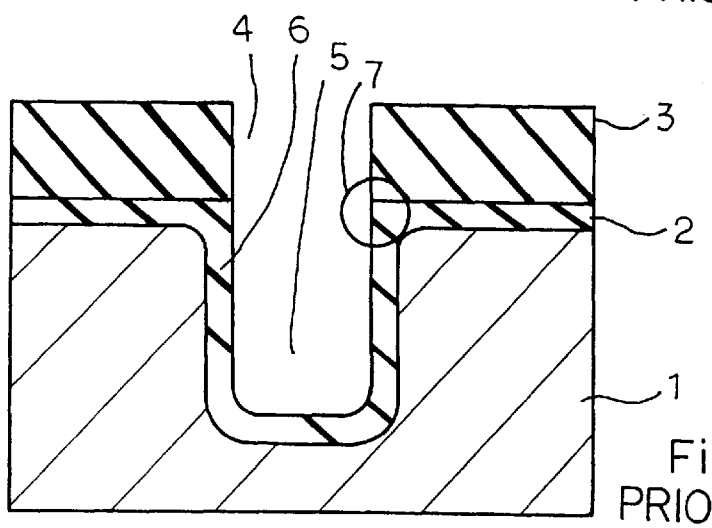
Figure 1D:
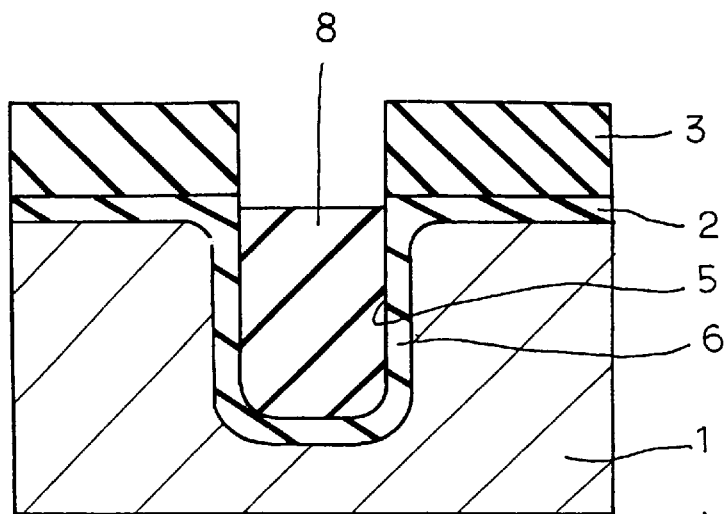
Figure 1E:
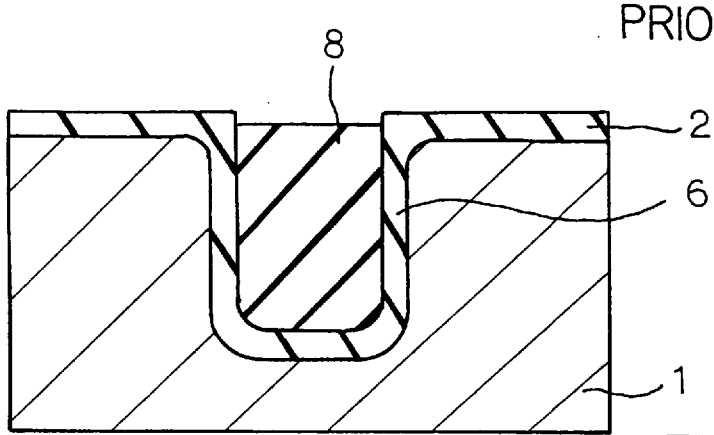
Figure 1F:
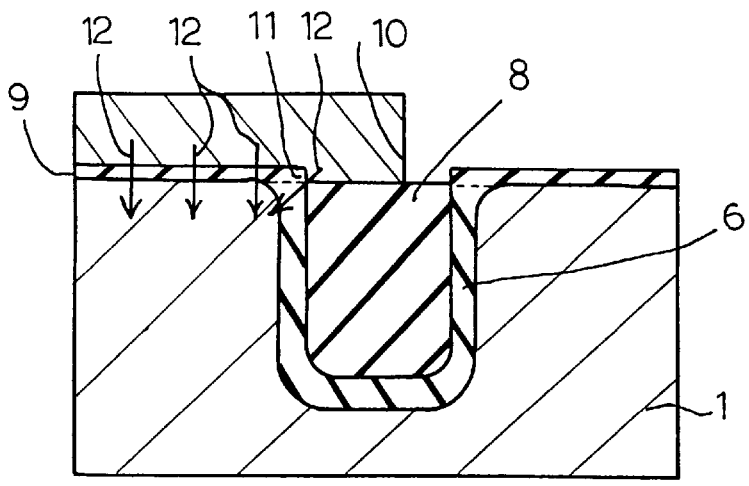
Figure 2:
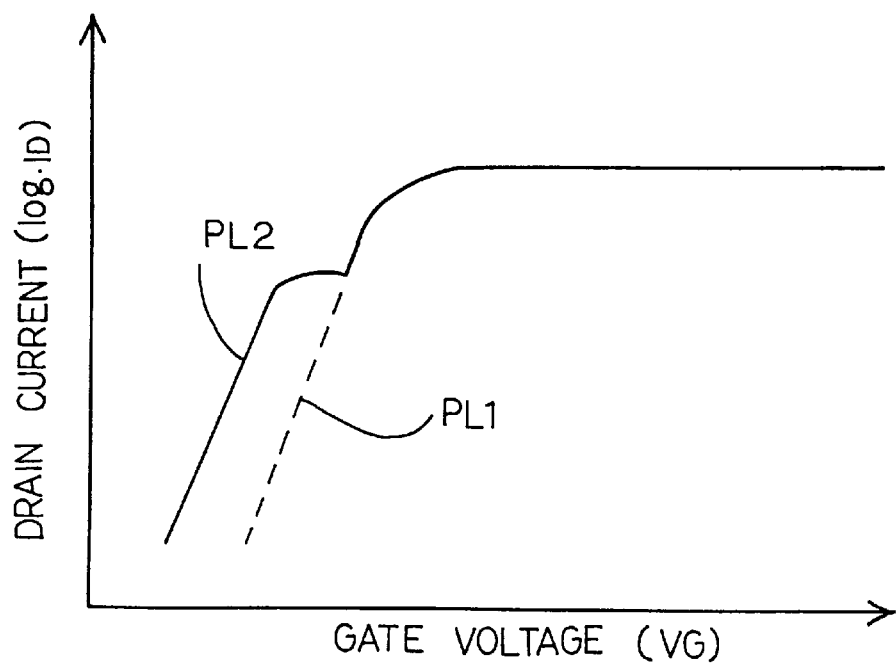
FIG. 2 is a graph showing the gate voltage-to-drain current characteristics affected by the kinks.
Figure 3:
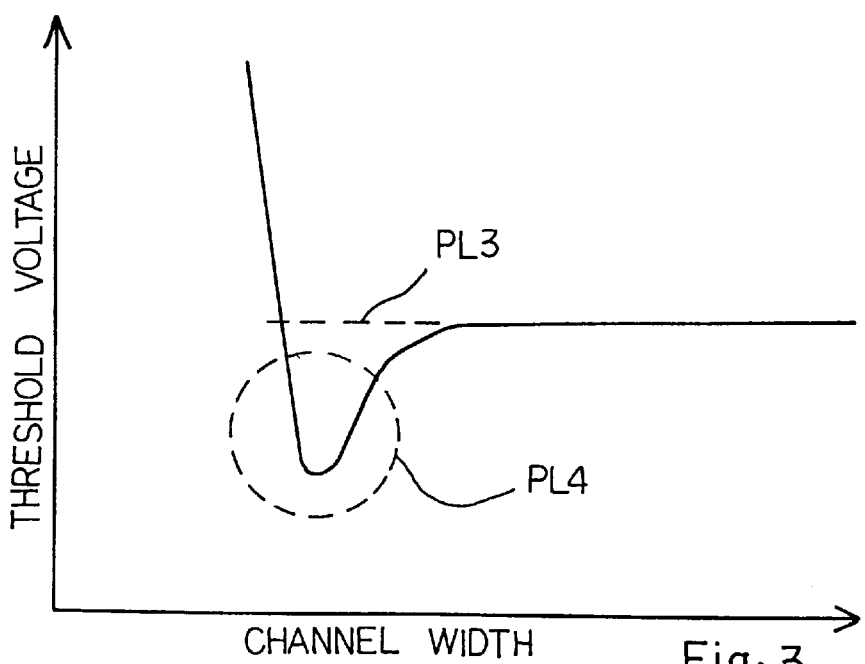
FIG. 3 is a graph showing the threshold in terms of the channel width affected by the inverse narrow width effect.
Figure 4A:
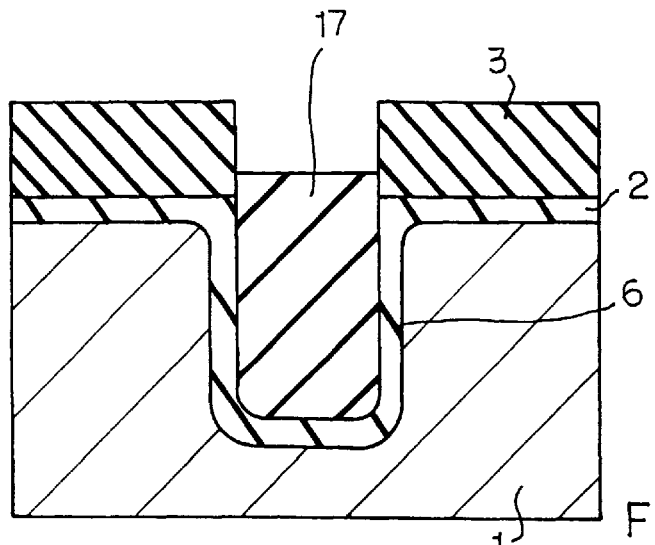
FIGS. 4A to 4C are cross sectional views showing the second prior art process proposed by Perera et al.
Figure 4B:
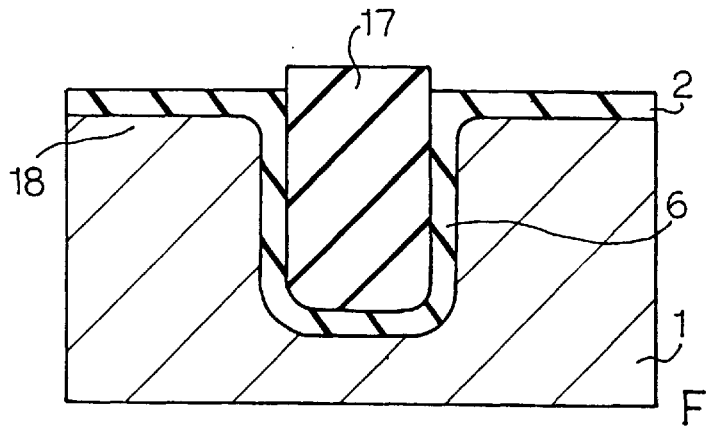
Figure 4C:
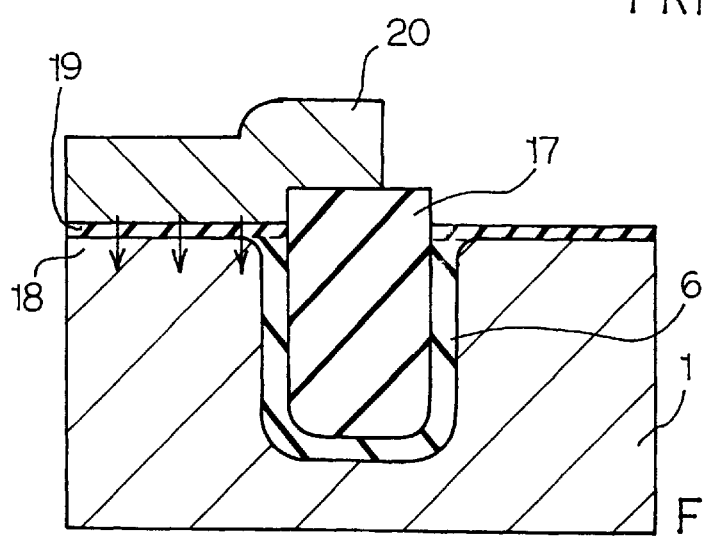
Figure 5A:
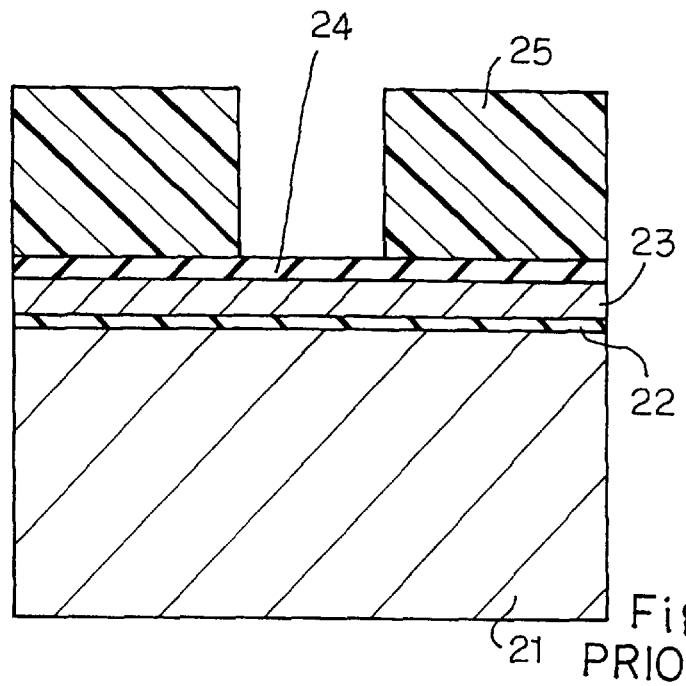
FIGS. 5A to 5G are cross sectional views showing the third prior art process disclosed in Japanese Patent Publication of Unexamined Application No. 7-193121.
Figure 5B:
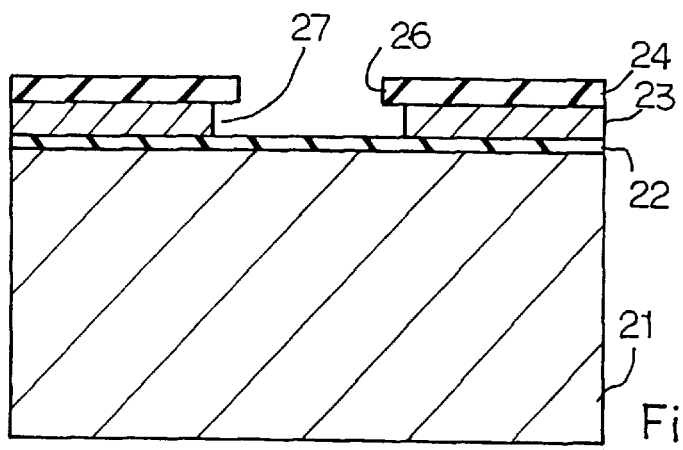
Figure 5C:
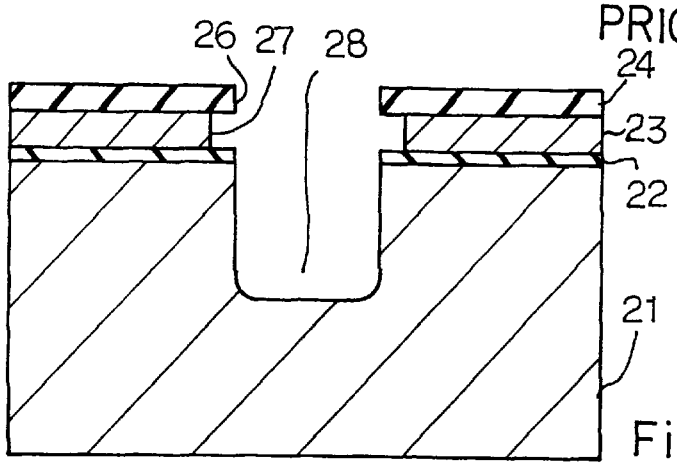
Figure 5D:
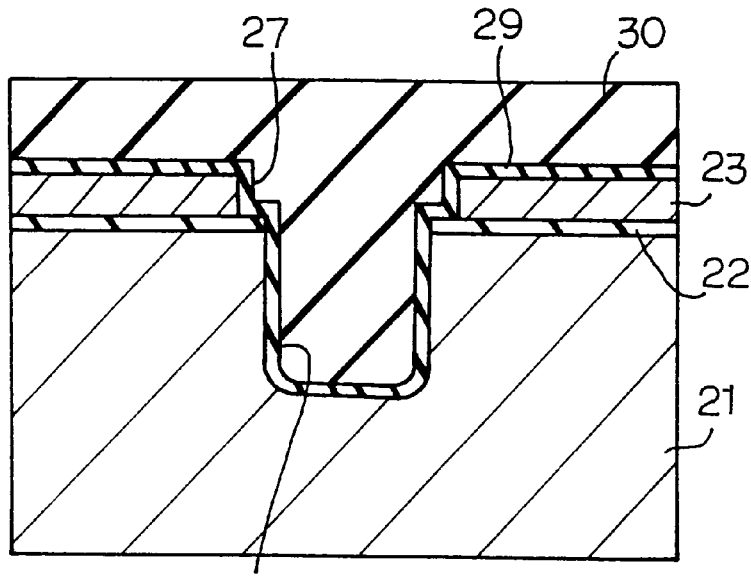
Figure 5E:
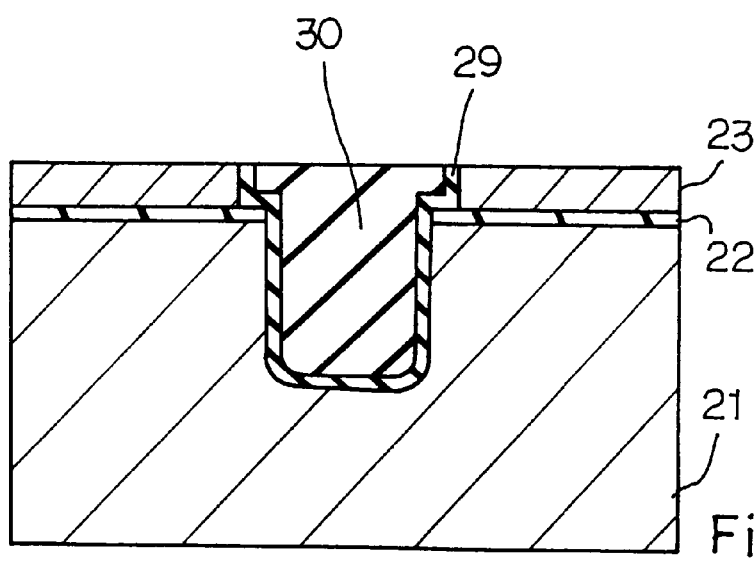
Figure 5F:
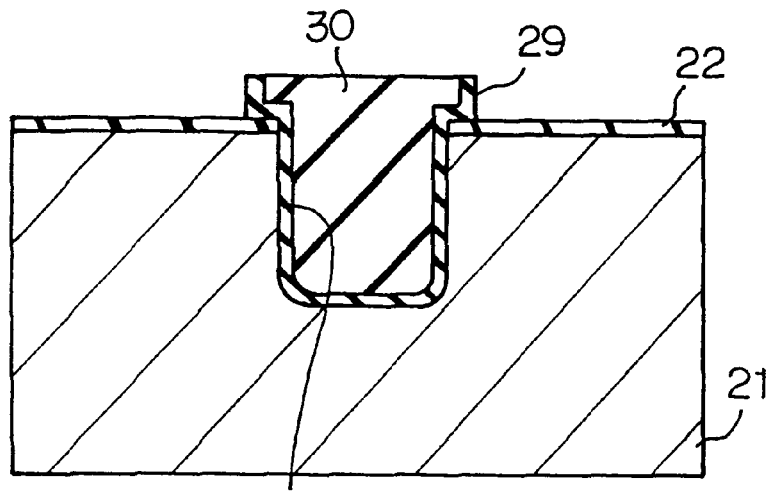
Figure 5G:
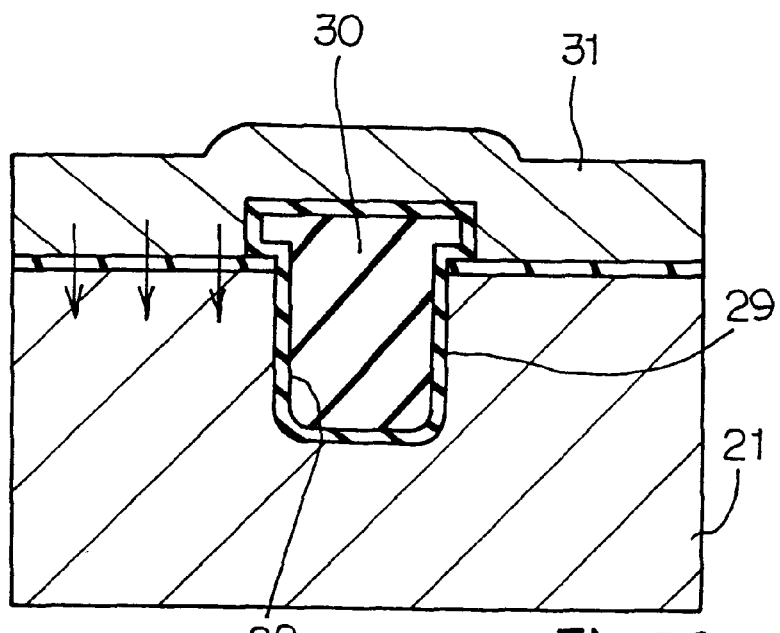

Polysilicon is deposited to 200 nanometers thick over the entire surface of the resultant semiconductor structure, and a photo-resist etching mask (not shown) is patterned on the polysilicon layer by using the lithographic techniques. Using the photo-resist etching mask, the polysilicon layer is selectively etched away, and the polysilicon layer is patterned into a gate electrode 75. The gate electrode 75 conformably extends on the gate oxide layer 74 and the silicon dioxide layer 72, and does not have any recess found in the gate electrode 20 due to the projecting head portion of the trench isolation 17 (see FIG. 4C). For this reason, the pattern image for the gate electrode 75 is transferred to the photo-resist layer over the polysilicon layer without undesirable deformation, and the gate electrode 75 is exactly shaped into the predetermined configuration.

Dopant impurity is ion implanted into the active area so as to form source and drain regions in a self-aligned manner with the gate electrode 75. The round boundary 70a prevents the electric field from serious concentration, and the field effect transistor is free from the kinks and the inverse narrow width effect.

Although particular embodiments of the present invention have been shown and described, it will be obvious to those skilled in the art that various changes and modifications may be made without departing from the spirit and scope of the present invention.

For example, the side wall spacer may be formed of polysilicon, and the secondary trench may be filled with polysilicon.

The silicon nitride may be removed before filling the secondary trench with the silicon dioxide or another material.

What is claimed is:

1. A process of fabricating a semiconductor device, comprising the steps of
    a) preparing a substrate formed of an oxidizable material;
    b) forming a first layer of a first material on a major surface of said substrate;
    c) forming a second layer of a non-oxidizable material on said first layer;
    d) forming a first opening in said second layer so that said first layer is exposed to said first opening;
    e) forming a side wall spacer on an inner wall of said second layer so as to form a second opening nested in said first opening, an area of said substrate is exposed to said second opening;
    f) forming a trench penetrating from said second opening into said substrate;
    g) oxidizing a surface portion of said substrate defining said trench so as to form an oxide wall defining a secondary trench and having an upper peripheral portion thicker than a lower portion thereof;
    h) filling said secondary trench with a second material having an upper surface coplanar with or close to the upper surface of said major surface so as to form a trench isolation in said substrate; and
    i) removing said second layer.

2. The process as set forth in claim 1, in which said step f) includes the sub-steps of
    f-1) selectively etching said substrate by using said side wall spacer and said second layer as an etching mask so as to form said trench, and
    f-2) removing said side wall spacer and a part of said first layer beneath said side wall spacer so as to expose a peripheral area of said substrate defining said trench to said first opening, and
    wherein the oxidation in said step g) proceeds from said peripheral area into said substrate so as to form said upper peripheral portion.

3. The process as set forth in claim 1, in which a boundary between said upper peripheral portion and said substrate is rounded.

4. The process as set forth in claim 2, in which said oxidizable material is silicon, and said oxidation is carried out at 980 degrees to 1100 degrees in centigrade so as to round a boundary between said upper peripheral portion and said substrate.

5. The process as set forth in claim 4, further comprising the step of
   j) fabricating a field effect transistor on an active area on one side of said trench isolation.

6. The process as set forth in claim 5, in which said step j) includes the sub-steps of
   j-1) introducing a dopant impurity into said active area through said first layer thereon,
   j-2) removing said first layer from said active area,
   j-3) forming a gate insulating layer substantially coplanar with or higher than said upper surface of said trench isolation on said active area, and
   j-4) forming a gate electrode on said gate-insulating layer through lithographic techniques.

7. A process of fabricating a semiconductor device, comprising the steps of
   a) preparing a substrate formed of an oxidizable material;
   b) forming a first layer of a first material on a major surface of said substrate;
   c) forming a second layer of a non-oxidizable material on said first layer;
   d) forming a first opening in said second layer so that said first layer is exposed to said first opening;
   e) forming a side wall spacer on an inner wall of said second layer so as to form a second opening nested in said first opening, an area of said substrate is exposed to said second opening;
   f) forming a trench penetrating from said second opening into said substrate by:
      f-1) selectively isotropically etching said substrate by using said side wall spacer as an etching mask so as to form a recess having an upper opening wider than said second opening,
      f-2) selectively anistropically etching said substrate by using said side wall spacer as an etching mask so as to form a groove penetrating from a bottom surface of said recess into said substrate and having an upper opening narrower than said upper opening of said recess, said recess and said groove forming in combination said trench, and
      f-3) removing said side wall spacer and a part of said first layer beneath said side wall space;
   g) oxidizing a surface portion of said substrate defining said trench so as to form an oxide wall defining a secondary trench and having an upper peripheral portion thicker than a lower portion thereof; and
   h) filling said secondary trench with a second material having an upper surface coplanar with or close to the upper surface of said major surface so as to form a trench isolation in said substrate.

8. The process as set forth in claim 7, in which said recess serves as said upper peripheral portion, and a boundary between said upper peripheral portion and said substrate is rounded.

9. The process as set forth in claim 7, in which said oxidizable material is silicon, and said oxidation is carried out at 980 degrees to 1100 degrees in centigrade so as to round a boundary between said upper peripheral portion and said substrate.

10. The process as set forth in claim 7, further comprising the step of
    i) removing said second layer after said step h).

11. The process as set forth in claim 10, further comprising the step of
    j) fabricating a field effect transistor on an active area on one side of said trench isolation.

12. The process as set forth in claim 11, in which said step j) includes the sub-steps of
    j-1) introducing a dopant impurity into said active area through said first layer thereon,
    j-2) removing said first layer from said active area,
    j-3) forming a gate insulating layer substantially coplanar with or higher than said upper surface of said trench isolation on said active area, and
    j-4) forming a gate electrode on said gate insulating layer through lithographic techniques.

* * * * *